(12) United States Patent
Hannah et al.

(10) Patent No.: US 6,625,052 B2
(45) Date of Patent: Sep. 23, 2003

(54) WRITE-ONCE POLYMER MEMORY WITH E-BEAM WRITING AND READING

(75) Inventors: Eric C. Hannah, Pebble Beach, CA (US); Michael A. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/966,014

(22) Filed: Sep. 27, 2001

(65) Prior Publication Data

US 2003/0058679 A1 Mar. 27, 2003

(51) Int. Cl.[7] .............................................. G11C 13/00
(52) U.S. Cl. ........................................ 365/118; 365/106
(58) Field of Search .................................. 365/118, 106

(56) References Cited

U.S. PATENT DOCUMENTS

| 4,534,016 A | * | 8/1985 | Kirkpatrick et al. ......... 365/128 |
| 4,800,526 A | * | 1/1989 | Lewis ......................... 365/118 |

* cited by examiner

*Primary Examiner*—Hoai Ho
(74) *Attorney, Agent, or Firm*—Paul E. Steiner

(57) ABSTRACT

Storing a data bit includes exposing a volume of a polymer, having a first conductivity, to an electron beam. Exposing damages cross-links in the volume of material. A first conductivity of the polymer is changed to a second conductivity and the data is stored in the bit.

14 Claims, 4 Drawing Sheets

WRITE-ONCE POLYMER MEMORY WITH E-BEAM WRITING AND READING

BACKGROUND OF THE INVENTION

1. Field of Invention

This invention relates generally to memory systems, and more specifically to systems and methods of writing data into a polymer and reading data from the polymer using an electron beam.

2. Background

Write-once mass storage devices presently used in computer systems are relatively large, electromechanical devices that can store tens of gigabytes of data. CD-ROM and Write-once DVD media store and access data through a read/write head above a rapidly rotating disk. The read/write head is moved radially to access data in different tracks of the rotating disk. Data transfer is limited by the speed at which the disc rotates and the speed with which the read/write head is positioned over the required track. Even with the fastest devices, these times are on the order of tens of milliseconds, because relatively large mechanical motions and large masses are involved. This time scale is orders of magnitude slower than the nanosecond time scales at which processors operate. The difference in time scales leads to periods of time when the processor is starved for data.

During the time the processor is starved for data, either valuable computing time is lost or the processor must perform another task, which also may lead to data starvation. Such data starved conditions are referred to in the art as being input/output (I/O) bound.

BRIEF DESCRIPTION OF THE DRAWINGS

The present invention is illustrated by way of example and is not limited in the figures of the accompanying drawings, in which like references indicate similar elements.

DETAILED DESCRIPTION

Figure 1:
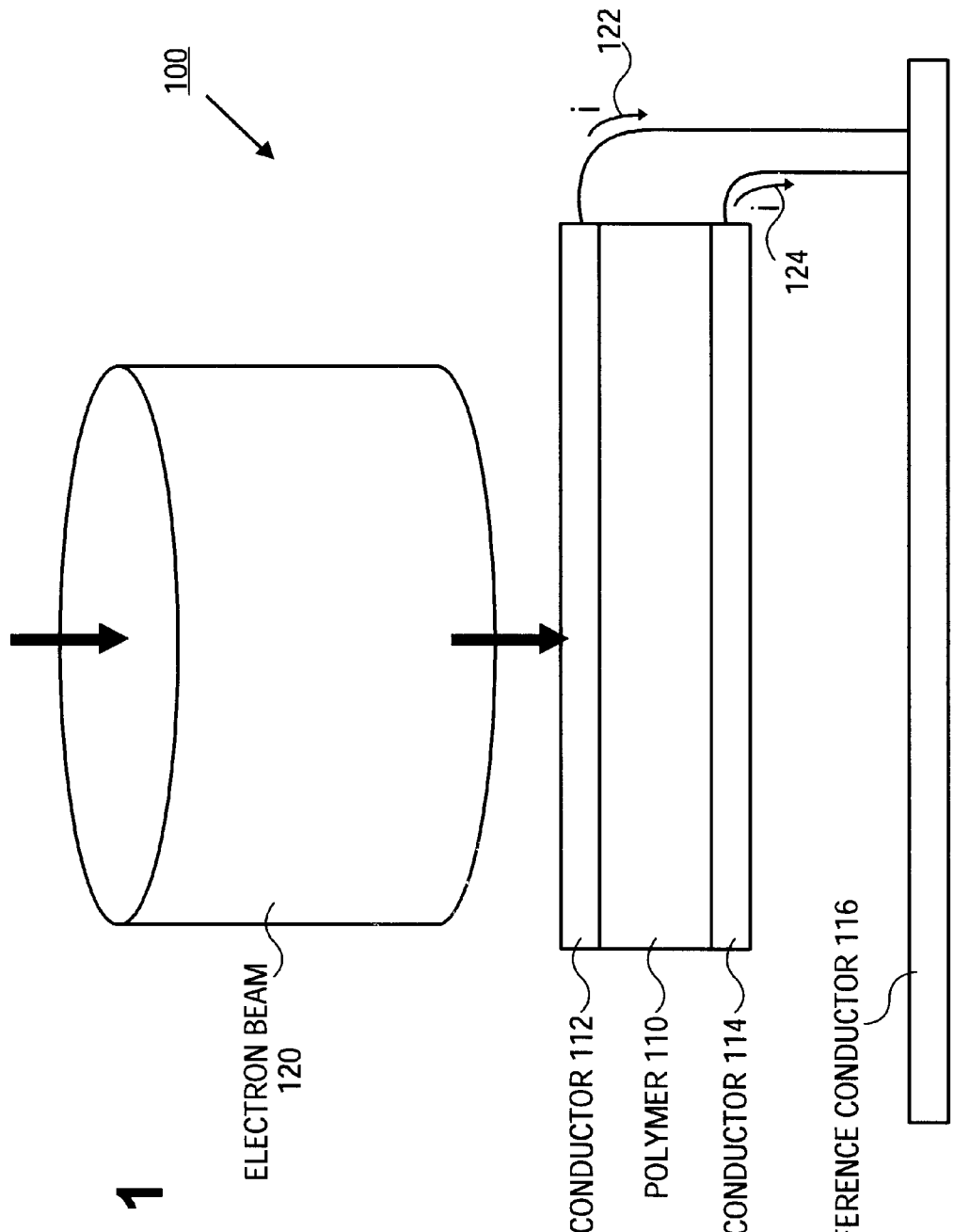
FIG. 1 illustrates a polymer memory element.

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those skilled in the art to practice the invention. The following detailed description is, therefore, not to be taken in a limiting sense, and the scope of the invention is defined only by the appended claims.

Systems and methods are disclosed to store data using a write-once polymer memory without any moving parts. In one embodiment of the present invention, an electron beam (e-beam) is used to irradiate a volume of a polymer, which corresponds to an encoded data bit location. Exposure to a high-energy e-beam changes the conductivity of the polymer, creating at least two different states of conductivity, which can be associated with the binary states of a bit e.g., "0" and "1." Reading the stored data is accomplished with a lower energy e-beam that does not alter the state of conductivity created by the high-energy e-beam during data writing. The low energy e-beam may be used according to various embodiments of the invention to read the conductivity of the polymer, which corresponds to the data stored therein. The invention is not limited to storing and reading binary data. The invention is applicable to n-ary data, however to simplify the description, the example of binary data will be followed. Moving parts have previously limited the data seek time associated with mechanically steering a read/write head.

In one embodiment of the present invention, a cross-linked polymer layer having a high level of electrical resistance (low conductivity) is exposed to a high-energy micro-column e-beam. The high-energy e-beam damages the cross-links, which lowers the level of electrical resistance (increased conductivity). An example of such a cross-linked polymer is Poly(methyl methacrylate) (PMMA) which possesses a high electrical resistance. Exposure to the high-energy electron beam creates radiation damage, which results in many broken chemical bonds between molecules. These broken bonds can then serve as hopping sites for incident electrons, resulting in a much lower electrical resistance state than when the polymer is more fully cross-linked.

In another embodiment of the present invention, a polymer may be used that is uncross-linked in the virgin state before data writing. In this uncross-linked state the polymer is conductive. Exposure to the high-energy e-beam source creates cross-links between molecules, which then change the conductivity of the polymer, making the polymer less conductive. Carbon impregnated polymers exhibit conductivity in the uncross-linked virgin state and can be used according to this embodiment of the present invention.

The association of the binary values for data e.g., "0" or "1" is completely arbitrary with respect to the state of conductivity within the polymer layer; the invention is not limited by the association made. An extension to n-ary data may be achieved by creating more than two distinct conductivity states within the polymer. For example, three distinct conductivity states could be associated with trinary data.

According to either embodiment of the present invention, described above, a high-energy e-beam is incident upon a polymer as shown in FIG. 1. FIG. 1 illustrates application of the invention to a polymer memory element. With reference to FIG. 1, system 100 includes a polymer 110 coupled with a conductor 112 and a conductor 114. A high-energy e-beam 120 is incident upon the polymer 110. Use of the term "high-energy" is application dependant and will depend upon several system design parameters. A non-exclusive list of system design parameters influencing the term "high-energy" includes the particular polymer, the degree of conductivity change desired, the e-beam exposure time (corresponding to the time allotted to change the conductivity of the polymer), and the volume of the data cell within the polymer. A typical range of "high-energy" is 1,000–10,000 electron volts (eV).

The polymer 110, shown in FIG. 1, may correspond to a data cell within an array of data cells. In a data write phase, electron e-beam 120 (at high-energy) creates a change in conductivity within the volume of polymer 110. Reading the data is accomplished by introducing current into the volume of polymer 110 via a lower energy e-beam than the energy level of the "high-energy" e-beam used for writing the data. This low-energy e-beam used for reading may be approximately 100 mill-electron volts (meV), and shall be small enough so that it will not degrade the data state of the polymer at the data bit location.

The low-energy e-beam introduces a current into a data bit location corresponding with system 100 in FIG. 1. The conductor 112 and reference conductor 116 provide a differential conducting path, which will conduct a majority of the current indicated by 122 when the polymer 110 is highly resistive. Alternatively, when the polymer 110 is highly conductive a majority of the electrons will propagate down through polymer 110 to conductor 114. The conductor 114 and the reference conductor 116 provide a second differential conducting path for a majority of the current indicated by 124. Either one or both of the currents may be used to associate the state of conductivity within the polymer 110 with the memory state of data stored in a bit. The e-beam 120 represents either the high-energy e-beam used to write the data or the low energy e-beam used to read the data.

Once the current has been steered, according to the state of the polymer 110, many embodiments of the present invention may be used to read the current. In one embodiment of the present invention, a fixed impedance reference layer (typically with an impedance much greater than the low impedance memory state of the polymer storage layer) is attached to the polymer on the side opposite to the electron-beam. The electron-beam's current distribution is then measured differentially between the conductor 112 and the conductor 114. The current will distribute differently based on the impedance of the polymer storage layer.

In another embodiment of the present invention, polymer 110 can be electroluminescent. The high-energy e-beam 120 can be used to change the state of electroluminescence (EL) of the polymer 110. A non-exclusive list of typical examples of electroluminescent polymers are poly(phenylene vinylene) polythiophenes, polypyridines, poly(pyridyl vinylenes), polyphenylenes and copolymers of the preceding. In one embodiment, e-beam 120 in the high-energy mode (write mode), can be used to disable the electroluminescent behavior of the polymer 110, thereby creating at least a first state of EL and a second state of EL within the polymer 110 that can be used to represent storage of data within the material. Alternatively, e-beam 120 in the high-energy write mode can be used to enable the electroluminescent behavior of the polymer 110, thereby creating at least a first state of EL and a second state of EL within polymer 110 that can be used to represent storage of data within the material.

Reading the data stored within polymer 110 (EL material) can be done with e-beam 110 in low energy (read mode). The low energy e-beam incident upon polymer 110 will cause an emission of photons when polymer 110 is enabled to be electroluminescent and will not cause an emission of photons when the electroluminescent behavior of the material has been disabled.

Figure 2:
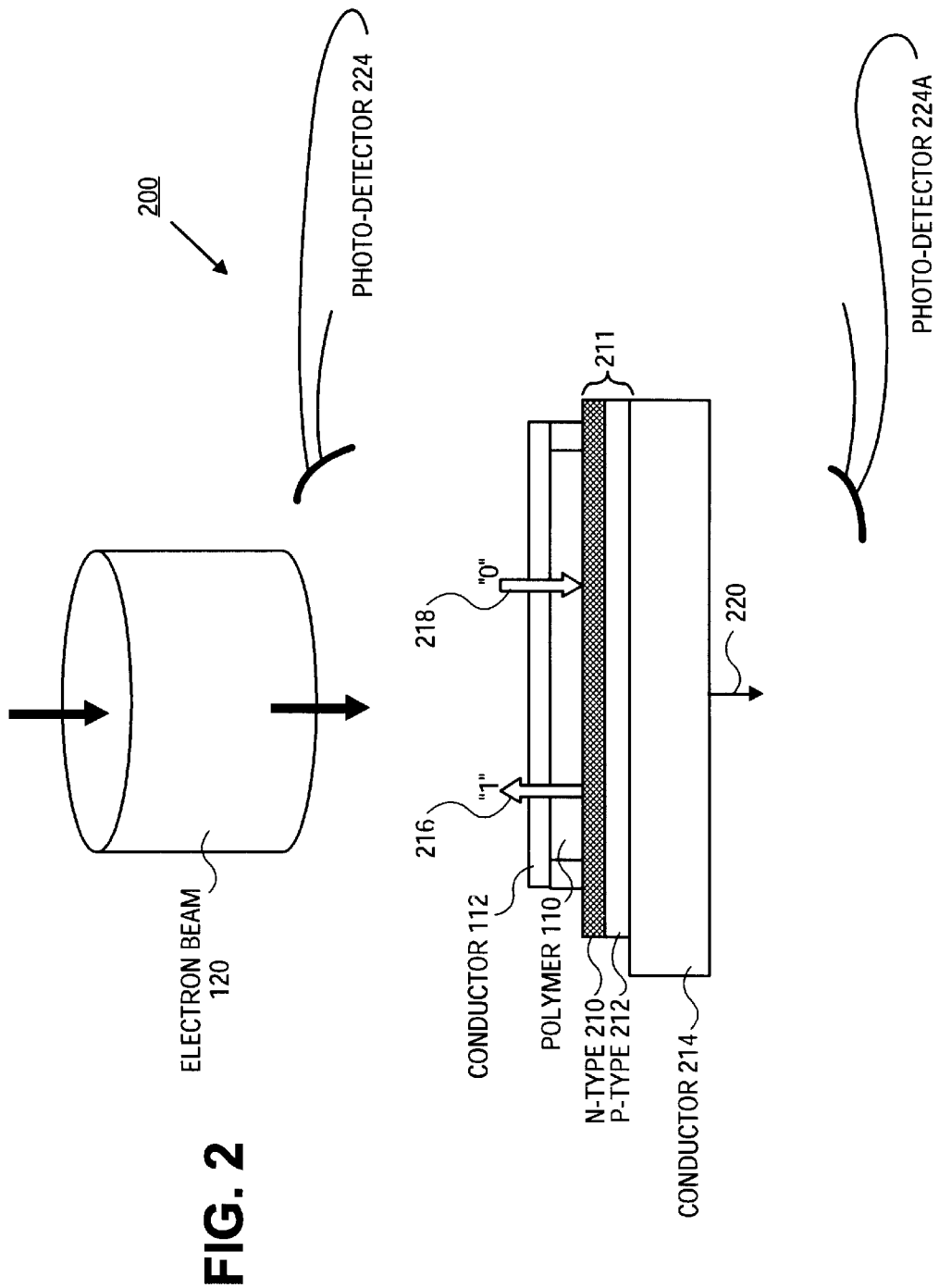
FIG. 2 illustrates a polymer/LED configuration.

In another embodiment of the present invention, the system 100 (FIG. 1) may be coupled with a semiconductor P-N junction as shown in FIG. 2 to achieve a differential light emission system 200 corresponding to the state of conductivity within the polymer 110. FIG. 2 illustrates a polymer/LED configuration. With reference to FIG. 2, a P-N junction 211 is placed beneath polymer 110. The P-N junction 211 may be created from a direct band semiconductor such as those commonly made from III–V elements, e.g., GaAs, or other electron excited light emitting structures including light emitting polymers. In one embodiment, doping is arranged so that the N-type 210 layer of the P-N junction 211 is coupled with the polymer 110 allows for easy transport of the filtered electrons into the P-N junction 211. A very thin, conductive interlayer may be used to backward bias the P-N junction. Below a P-type 212 layer of the P-N junction, a conductor 214 is placed which may be a normal metal ground pad. The conductor 214 supplies holes to the P-N junction. The material used for the conductor 214 may be selected to optimize the reflection of the light generated in the P-N junction. An advantage of using a direct-band semiconductor is that the recombination of electrons and holes can create photons without requiring phonon emission to conserve momentum. The thickness of the N-type 210 layer and the P-type 212 layer must be sufficient to support the full transition region and optimally couple to external electromagnetic modes.

In another embodiment of the present invention, differential light emission is achieved by the system 200 by varying the amplitude of the current passed by the varying conductivity of the polymer 110 between the cross-linked and damaged states. In one conductivity state 218, the polymer 110 will conduct a majority of current through its thickness to the P-N junction resulting in a maximum emission of light. The maximum emission of light may correspond to one memory state for the data stored therein. The emitted light can be sensed by photo-detector 224. In another conductivity state 216, a minimum amount of current is conducted through the polymer 110, instead the majority of the current is "bled off" via conductor 112, as previously described resulting in a minimum emission of light from the P-N junction. The minimum emission of light may correspond to a second memory state for the data stored therein.

The polymer/P-N junction structure, shown at 200, need not be etched out from the surrounding material to allow photons to escape the P-N junction 211. The material layer (conductor 112) above the P-N junction may be made very thin. Photons can penetrate more than a micron of metal conductor thickness and much further through polymers. Therefore, the conductor 112 may be on the order of a micron or less in thickness, thereby providing a sufficient electrically conductive path while allowing photons to pass therethrough. The system 200 acts as a tiny dot illuminator when irradiated with the read e-beam, causing the P-N junction to emit light in one conductivity (memory) state while the P-N junction remains dark in another conductivity (memory) state.

Figure 3:
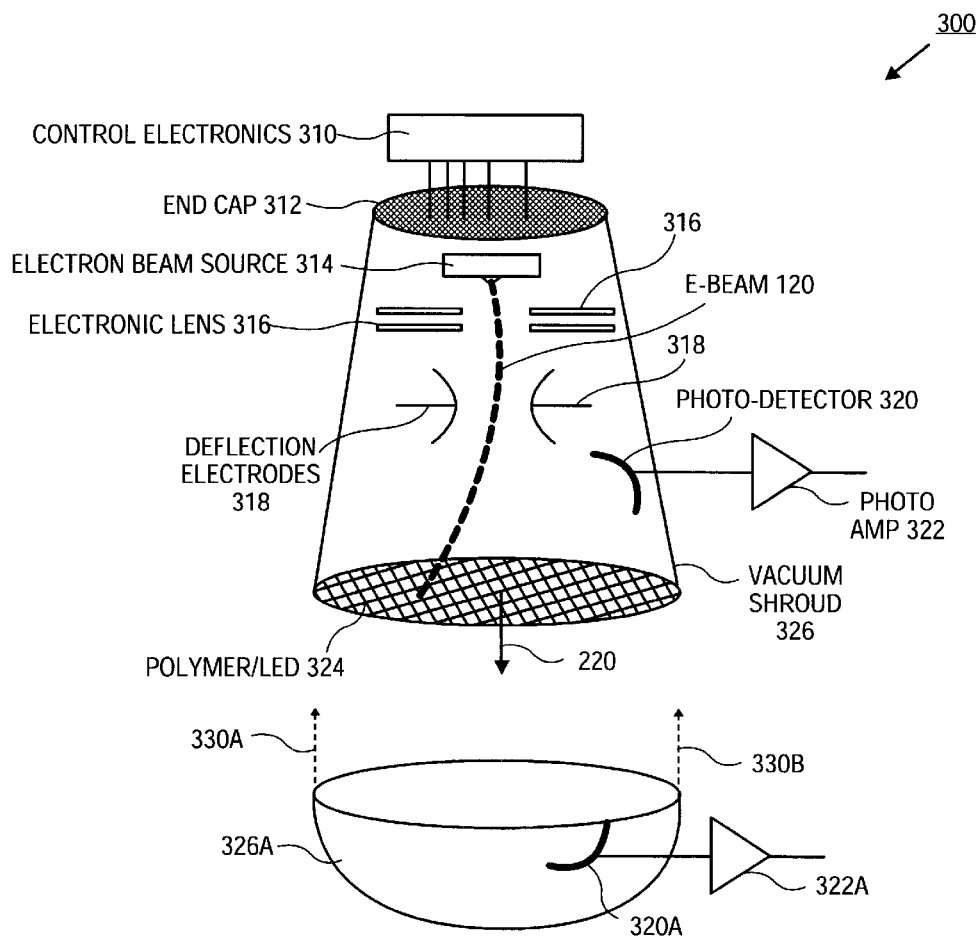
FIG. 3 illustrates a polymer/LED memory device.

An embodiment of the present invention is shown in FIG. 3 illustrating a polymer/P-N junction memory device. With reference to FIG. 3, one or more polymer memory data elements are indicated at a polymer/LED 324 array. A vacuum shroud 326 and an end cap 312 form a closed container (a high vacuum environment) in which electron beam source 314 emits e-beam 120, incident upon the polymer/LED 324 array. Control electronics 310 may be used in conjunction with the electron beam source 314 as needed to control the e-beam source. The e-beam 120 may be steered by means of electron lens 316 and deflection electrodes 318.

The e-beam 120 may be used to write data to the polymer/LED 324 array, as previously described, as well as to read data written therein. Accordingly, the level of light generated by the polymer/P-N junction of the data bit is measured by a sensitive photo-detector 320, by methods well known in the art. The vacuum shroud 326 can be made reflective on the inside, thereby acting as an integrating sphere for the emitted photons, which increases the signal-to-noise ratio for the measurement made by the photo-detector 320. The output of the photo-detector 320 may be amplified as required by photo amp 322. The e-beam 120 is steered across the polymer/LED 324 array to read data stored in the data bit locations corresponding to dots on the surface of polymer/LED 324. Thus, writing and reading data is accomplished without the mechanically articulated parts required by the CD-ROM and the write-once DVD. Using the teachings of the present invention, the seek time to reach any block of data is on the order is tens of microseconds.

A read-after-write capability is provided during data bit writing by the conductivity state switching within the polymer 110. During data writing with the high-energy e-beam, the impedance of the polymer 110 will change—due to the induced state change, resulting in a sudden pulse of light as electron current is passed or removed from the P-N junction. Sensing this pulse of light will provide a read-after-write capability similar to that provided by the second head in a tape drive or similar polarization shift effect in a magneto-optic disc drive.

In an alternative embodiment, the substrate (conductor 214 in FIG. 2) may be made sufficiently thin or transparent to allow photons to be emitted from the opposite side that e-beam 120 is incident upon polymer 110. This opposite side is indicated as 220 in FIG. 2 and FIG. 3. The emitted light may be sensed from the lower side of the structure as shown in FIG. 2 at photo-detector 224a and in FIG. 3 at photo-detector 320a. The photo-detector 320a may be configured with photo-amp 322a. This arrangement has the feature of removing the electron optics from the photo-detector's field of view. One way to provide a high vacuum environment to the lower side of vacuum shroud 326 is to couple fixture 326a with vacuum shroud 326 by mating as indicated at 330a and 330b.

The e-beam 120 may be on the order of 20 nanometers in diameter. It is possible to steer the e-beam 120 through an angle of approximately 20 degrees, as will be explained in conjunction with FIG. 4. Very small e-beam sources may be manufactured, made using silicon processes. An example of such a device is the electron micro-column made by the Sensors Actuators and Microsystems Laboratory (SAMLAB), which is part of the Institute of Microtechnology, University of Neuchâtel, located in Switzerland. These very small e-beam sources (micro-column e-beam sources) can be produced in a form factor measuring approximately three millimeters wide and approximately one millimeter high. In one embodiment, using these parameters, a data storage device may be built to store approximately a terabyte of data on a polymer/LED area of several square centimeters.

Figure 4:
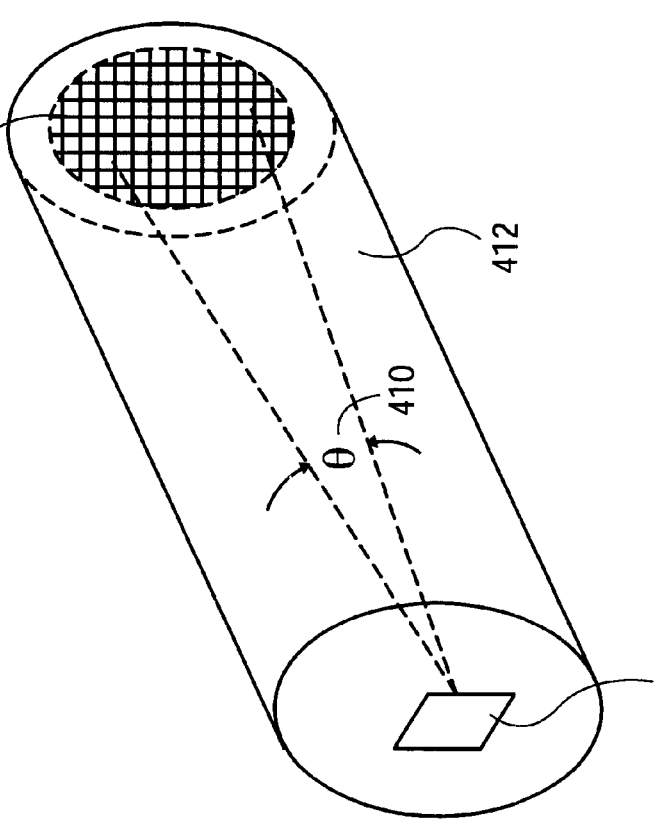
FIG. 4 shows an alternative embodiment of a memory device.

The present invention may be incorporated into various memory devices. FIG. 4 shows an alternative embodiment of a memory device 400. With reference to FIG. 4, a cylindrical container 412 is shown having a polymer/LED layer 324 and an electron beam source 314. The e-beam source 314 may be steered through an angle 410 as shown. Thus, data may be written to an array having approximately 200 gigabytes of data in a device occupying a volume of approximately several cubic inches. These data storage devices may be configured in an array to achieve terabyte data storage capacities.

It is expected that many other shapes and configurations of data storage devices are possible within the teachings of the present invention. For example, a cube may be configured (not shown) with polymer arrays lining the interior surfaces thereof. One or more electron beam sources may be configured within the cube, each facing an interior surface of the cube and being capable of writing and reading data stored in each polymer array.

Thus, a novel solution to electron beam recording and sensing of data bits is disclosed. Although the invention is described herein with reference to specific preferred embodiments, many modifications therein will readily occur to those of ordinary skill in the art. Accordingly, all such variations and modifications are included within the intended scope of the invention as defined by the following claims.

What is claimed is:

1. A method to store a bit of data, comprising:

exposing a volume of material, having a first conductivity, to an electron beam; and damaging cross-links in the volume of material during said exposing, wherein the first conductivity of the volume of material is changed to a second wherein the volume of material is a polymer.

2. Said method of claim 1, wherein the first conductivity is associated with a first memory state of the bit of data and the second conductivity is associated with a second memory state of the bit of data.

3. A method to store a bit of data, comprising:

exposing a volume of material, having a first conductivity, to an electron beam; and forming cross-links in the volume of material during said exposing, wherein the first conductivity of the volume of material is changed to a second wherein the volume of material is a polymer.

4. Said method of claim 3, wherein the first conductivity is associated with a first memory state of the bit of data and the second conductivity is associated with a second memory state of the bit of data.

5. An apparatus to store a bit of data, comprising:

a volume of material having a first side and a second side;

a first conductive material disposed on said first side; and a second conductive material disposed on said second side, wherein an electron beam, irradiated on said volume of material, having damaged cross-links in said volume of material wherein a conductivity of said volume of material is wherein the volume of material is a polymer.

6. An apparatus to store a bit of data, comprising:

a volume of material having a first side and a second side;

a first conductive material disposed on said first side; and a second conductive material disposed on said second side, wherein an electron beam, irradiated on said volume of material, having formed cross-links in said volume of material wherein a conductivity of said volume of material is wherein the volume of material is a polymer.

7. An apparatus to store data, comprising:

a polymer material;

a first volume of the polymer material having cross-links in the first volume of the polymer material in a first state; and a second volume of the polymer material having cross-links in the second volume of the polymer material in a second state, wherein the first state of the cross-links in the first volume of the polymer material corresponds to a first conductivity of the first volume of the polymer material, wherein the second state of the cross-links in the second volume of the polymer material corresponds to a second conductivity of the second volume of the polymer material, wherein the first conductivity is different from the second conductivity, and wherein data is stored in the polymer material in accordance with the first conductivity and the second conductivity.

8. The apparatus of claim 7, wherein the first conductivity is associated with a first memory state of a first bit of data and the second conductivity is associated with a second memory state off a second bit of data.

9. The apparatus of claim 7, wherein the first state of the cross-links in the first volume of the polymer material corresponds to a damaged cross-link state.

10. The apparatus of claim 9, wherein the second state of the cross-links in the second volume of the polymer corresponds to a cross-linked state.

11. The apparatus of claim 7, wherein the first state of the cross-links in the first volume of the polymer material corresponds to a created cross-link state.

12. The apparatus of claim 11, wherein the second state of the cross-links in the second volume of the polymer corresponds to an uncross-linked state.

13. The apparatus of claim 7, further comprising:

a third volume of the polymer material having cross-links in the third volume of the polymer material in a third state, wherein the third state of the cross-links in the third volume of the polymer material corresponds to a third conductivity of the third volume of the polymer material, wherein the third conductivity is different from both the first conductivity and the second conductivity, and wherein at least trinary data is stored in the polymer material in accordance with the first conductivity, the second conductivity, and the third conductivity.

14. The apparatus of claim 7, wherein the polymer material defines a first side and a second, the apparatus further comprising:

a first electrode disposed on the first side of the polymer material; and a second electrode disposed on the second side of the polymer material.

* * * * *